(12) United States Patent
Ono et al.

(10) Patent No.: US 7,728,491 B2
(45) Date of Patent: Jun. 1, 2010

(54) PIEZOELECTRIC DEVICES AND METHODS FOR MANUFACTURING SAME

(75) Inventors: Kozo Ono, Saitama (JP); Takahiro Inoue, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 12/251,312

(22) Filed: Oct. 14, 2008

(65) Prior Publication Data

US 2009/0096329 A1    Apr. 16, 2009

(30) Foreign Application Priority Data

Oct. 15, 2007  (JP)  ............................. 2007-267445

(51) Int. Cl.
*H01L 41/053*    (2006.01)

(52) U.S. Cl. ..................................... 310/348
(58) Field of Classification Search ................ 310/348, 310/351–353

See application file for complete search history.

(56) References Cited

U.S. PATENT DOCUMENTS

| | | | |
|---|---|---|---|
| 4,065,684 A * | 12/1977 | Hermann et al. | 310/351 |
| 4,639,631 A * | 1/1987 | Chason et al. | 310/344 |
| 4,932,956 A * | 6/1990 | Reddy et al. | 606/192 |
| 6,450,039 B1 * | 9/2002 | Masuda | 73/756 |
| 7,564,177 B2 * | 7/2009 | Yoshimatsu et al. | 310/365 |

FOREIGN PATENT DOCUMENTS

JP    2003-158439    5/2003

* cited by examiner

*Primary Examiner*—Thomas M Dougherty
(74) *Attorney, Agent, or Firm*—Klarquist Sparkman, LLP (57) ABSTRACT

Piezoelectric devices and associated fabrication methods are disclosed. An exemplary piezoelectric device includes a piezoelectric vibrating piece having first and second electrodes and first and second surfaces, a glass base having first and second surfaces, and a lid. These three parts also form the device package. The first surface of the piezoelectric vibrating piece is mounted to the base, and the lid is mounted to the second surface of the piezoelectric vibrating piece to seal the package. The glass base includes first and second metal wires having ends that protrude from the surfaces of the base. The side surfaces of the protruding wire ends are connected to the first and the second electrodes, respectively. Manufacture is performed using whole wafers that are processed, sandwiched, bonded, and then cut to produce individual devices.

6 Claims, 10 Drawing Sheets

PIEZOELECTRIC DEVICES AND METHODS FOR MANUFACTURING SAME

CROSS-REFERENCE TO RELATED PATENT APPLICATION

This application claims priority to, and the benefit of, Japan Patent Application No. 2007-267445, filed on Oct. 15, 2007, in the Japan Patent Office, the disclosure of which is incorporated herein by reference in its entirety.

FIELD

This disclosure relates to, inter alia, piezoelectric devices of which the package is formed from a glass wafer with embedded metal wires. The disclosure also pertains to methods for manufacturing piezoelectric devices.

DESCRIPTION OF THE RELATED ART

With the progress of miniaturization and/or increases in the operating frequency of mobile communication apparatus and office automation (OA) equipment, piezoelectric vibrators used in this equipment must be progressively smaller and/or operate at higher frequency. Also required are piezoelectric vibrators that can be surface-mounted on circuit boards.

Contemporary piezoelectric vibrators comprise piezoelectric vibrating pieces sealed in respective device packages, wherein the piezoelectric vibrating piece is connected to electrodes in the package. Generally, the package is made of glass or ceramic, and defines a predetermined interior volume to contain the piezoelectric vibrating piece. At the bottom of the package, through-holes are formed through the interior portion and the bottom portion of the package, and the through-holes are sealed with high-temperature solder or the like.

Example package-sealing techniques using a ceramic package are discussed in Japan Unexamined Patent Publication No. 2003-158439, in which a first adhesive such as a brazing filler metal is applied on the top of the package. The brazing filler metal is melted in a heat chamber with application of pressure to crimp the package. Then, a sealing material such as high-temperature solder is applied to the through-holes formed in the package. In a chamber under a vacuum or an inert-gas atmosphere, the package is sealed by melting the high-temperature solder using a laser beam.

Further regarding the sealing method discussed in the JP '439 document cited above, sealing material is inserted in the through-holes formed on the bottom of the package, and the through-holes are sealed by melting the sealing material using a laser beam. However, this sealing must be performed individually with each piezoelectric vibrating piece being packaged on an assembly line. Hence, mass-production (with consequent item cost reduction) is difficult.

In the present invention, piezoelectric devices are manufactured in wafers after forming a glass base using metal wires of a glass wafer, in which metal wires (used as lead wires) are arranged that have low electrical resistance and have predetermined spaces between them. Another purpose of the present invention is to provide piezoelectric devices using glass wafers containing metal wires.

SUMMARY

The deficiencies of the prior art summarized above are cured by piezoelectric devices and methods for their manufacture, as disclosed hereinbelow.

According to a first aspect, piezoelectric devices are provided. An embodiment of such a device comprises a piezoelectric vibrating piece, a base, and a lid. The piezoelectric vibrating piece comprises first and second electrodes, a first surface, and an opposing second surface. The base is made of glass and has a first surface and an opposing second surface. The second surface of the piezoelectric vibrating piece is mounted to the first surface of the base. The lid is attached to the first surface of the piezoelectric vibrating piece to form, with the base and piezoelectric vibrating piece, a package containing the piezoelectric vibrating piece. The glass base comprises first and second metal wires having respective ends, with respective side surfaces. The ends and respective side surfaces protrude at least partially from the first surface of the base, and the protruding ends and side surfaces are connected to the first and the second electrodes, respectively. Because the side surfaces of the ends of the first and second metal wires at least partially protrude from the first surface of the base, the respective ends of the wires are connected securely to the first and second electrodes.

In certain embodiments, with respect to each of the first and second metal wires, substantially the entire side surface at the respective end protrudes from the first surface of the base. This amount of protrusion provides larger areas of attachment of the wire ends to the first and second electrodes, which provides good conduction between the wires and the electrodes.

In other embodiments, with respect to each of the first and second metal wires, a portion of the side surface at the respective end is covered by the glass of the base, which prevents unintended bending of the wire ends during manufacturing of the piezoelectric device.

In certain embodiments, with respect to the first and second metal wires, each metal wire comprises a surficial gold (Au) layer, and the protruding gold-layered side surfaces of the protruding ends are connected to the first and second electrodes, respectively. The surficial gold layer on the first and second metal wires facilitates connection of the wires to the first and second electrodes, respectively, by application of heat and pressure.

According to another aspect, methods are provided for manufacturing a piezoelectric device. An embodiment of such a method comprises preparing a lid wafer, a piezoelectric wafer, and a base wafer. The lid wafer defines multiple lids. The piezoelectric wafer defines multiple piezoelectric vibrating pieces formed therein, each piece comprising first and second electrodes. The base wafer is made of glass and has a first surface. The base wafer is prepared to define multiple bases each comprising first and second metal wires extending through the glass of the base wafer. Each wire has a respective end and a respective side surface at the end that protrude at least partially from the first surface of the base wafer. A wafer sandwich is formed comprising the base wafer, the piezoelectric wafer superposed on and aligned with the base wafer, and the lid wafer superposed on and aligned with the piezoelectric wafer. Thus, respective lids, bases, and piezoelectric vibrating pieces are registered with each other, and the protruding ends of the first and second wires contact respective first and second electrodes. The layers of the wafer sandwich are anodically bonded together, which also achieves bonding of the protruding ends of the first and second wires to the respective first and second electrodes. Then, the bonded three-wafer sandwich is cut to separate individual piezoelectric devices thus formed in the sandwich from each other. Cutting can be performed using a dicing saw or laser saw, for example. In this method, sealing of wire through-holes as required in conventional methods is not required.

Also, since multiple piezoelectric devices can be manufactured simultaneously on the wafer level, the manufacturing process is substantially lower in cost than conventional methods. Also, by cutting the wafer sandwich using a dicing saw or laser saw, for example, area otherwise lost to waste incurred by etching can be reduced, allowing more piezoelectric devices to be obtained from a single wafer sandwich.

In preparing the base wafer, in some embodiments the roughness of surfaces of the first and second metal wires is increased to improve the affinity of the wires to the glass of the base wafer. Desirably, a gold (Au) layer is formed on the roughened surfaces. Increasing glass-wire affinity can be important in view of the different coefficients of thermal expansion of glass versus of the wires. If the wire-glass affinity is weak, the wires may become detached from regions of the glass. Surface roughening avoids this potential problem.

The first and second electrodes may be formed to have an under-layer and a surficial gold (Au) layer. With such electrodes, during the anodic bonding step, the gold layers of the first and second metal wires and the gold layers of the first and second electrodes are electrically connected in a secure manner. This assures good conduction between the first and second metal wires and the first and second electrodes, respectively.

In certain method embodiments, the side surfaces of the protruding ends of the first and second metal wires also protrude from the glass of the base wafer. With such protrusion, contact areas between the wires and respective electrodes are maximized to achieve good conduction.

Various embodiments disclosed herein are readily amenable to automation and mass production in an efficient manner.

BRIEF DESCRIPTION OF THE DRAWINGS

FIGS. 1A-1D are schematic cross-sectional views of an embodiment of a crystal vibrator 100, of which FIG. 1A is a cross-sectional view of FIG. 1C.

DETAILED DESCRIPTION OF THE PREFERRED EMBODIMENTS

First Embodiment of Crystal Vibrator

Figure 1A:
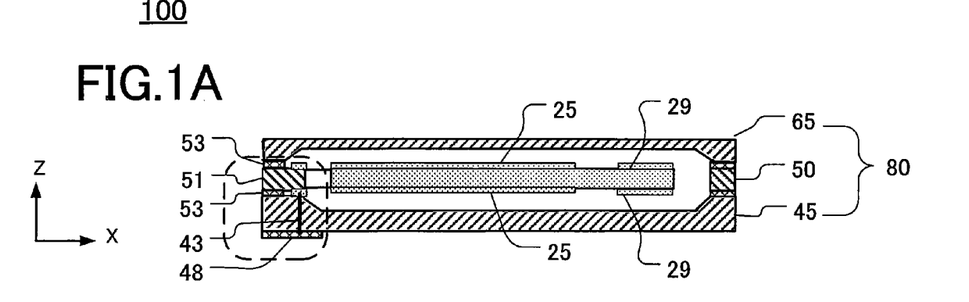
Figure 1B:
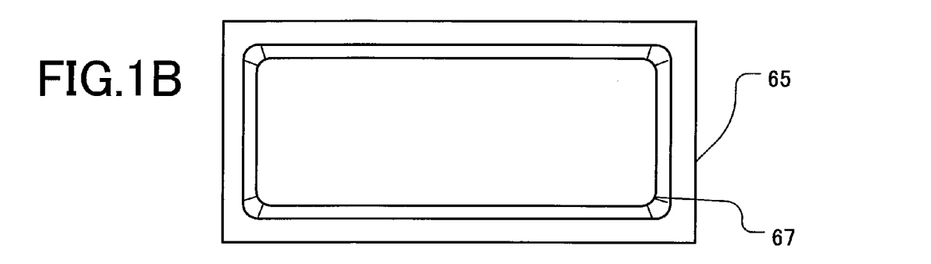
FIG. 1B is an inner view of the lid 65.
Figure 1C:
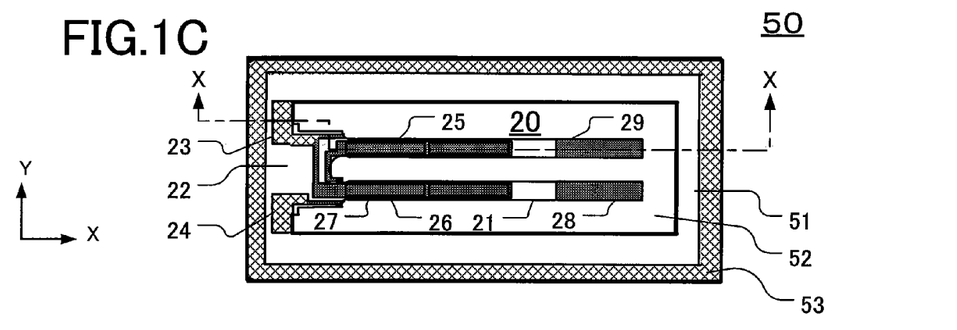
FIG. 1C is a top view of the crystal frame 50.
Figure 1D:
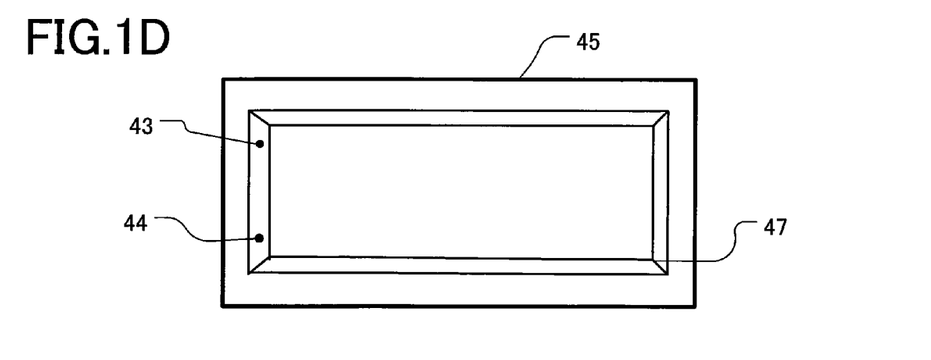
FIG. 1D is a top view of the base 45.

A crystal vibrator 100 (as an exemplary piezoelectric device) according to this embodiment is shown in FIGS. 1A-1D, which are schematic views. FIG. 1A is an elevational section along the line X-X in FIG. 1C, FIG. 1B is a plan view of the under (inner) surface of the lid 65, FIG. 1C is a top (plan) view of the crystal frame 50, and FIG. 1D is a top (plan) view of the base 45.

In FIG. 1A the crystal vibrator 100 includes a crystal frame 50 in which a tuning-fork type crystal vibrating piece 20 is situated substantially centrally. A base 45 is attached to the bottom surface of the crystal frame 50, and a lid 65 is attached to the top surface of the crystal frame 50. The lid 65 can be formed of Pyrex® glass, borosilicate glass, or soda glass (hereinafter called the "glass wafer" 60). The lid 65 has a concave region 67 on the surface facing the crystal frame 50. (See FIG. 1B showing the concave portion 67 in the lid 65; the concave portion 67 is formed by etching.) The base 45 is made from a glass wafer 40 containing metal wires. The crystal frame 50 was formed from a crystal wafer 10, in which the crystal frame and the tuning-fork type crystal vibrating piece 20 were formed by etching.

As shown in FIG. 1C, the crystal frame 50 includes the so-called tuning-fork type crystal vibrating piece 20 located substantially centrally. An outer frame 51 surrounds the piece 20, with a void 52 being defined between the tuning-fork crystal vibrating piece 20 and the outer frame 51. The void 52, which defines the outline of the tuning-fork type crystal vibrating piece 20, is formed by etching of the crystal material. The tuning-fork type crystal vibrating piece 20 comprises a base portion 22 and a pair of vibrating arms 21 extending horizontally from the base portion 22. Groove regions 27 are defined on the vibrating arms 21. The base portion 22 and the outer frame 51 are formed as a single unit. A first base electrode 23 and a second base electrode 24 are formed on a "first surface" (upper surface) of the base portion 22, on a "second surface" (lower surface) of the base portion 22, and on the outer frame 51.

On the first and second surfaces of the crystal vibrating piece 20, first and second excitation electrodes 25, 26, respectively, are formed. The first excitation electrode 25 is connected to the first base electrode 23 on the base portion 22 and the outer frame 51, and the second excitation electrode 26 is connected to the second base electrode 24 on the base portion 22 and the outer frame 51. Also, near the distal ends of the vibrating arms 21 of the tuning-fork type crystal vibrating piece 20, respective "weights" 28, 29 are formed. The first and second base electrodes 23, 24, the first and second excitation electrodes 25, 26, and the weights 28, 29 are formed using a photolithography process. Whenever a voltage is applied to these electrodes, the tuning-fork type crystal vibrating piece 20 vibrates with a predetermined frequency.

The weights 28, 29 facilitate vibration of the vibrating arms 21 and are used for adjusting the vibration frequency.

Each of the front and back surfaces of the outer frame 51 comprises a metal film 53. The metal films 53 are formed by a sputtering or vacuum-deposition technique. Each metal film 53 desirably is a layer of aluminum (Al) having a thickness of approximately 500-1500 Ångstroms.

As FIG. 1D shows, the base 45 is formed of a glass wafer 40 containing metal wires. The base 45 includes a concave region 47, formed by etching part way into the thickness of the glass wafer 40. The base includes two metal wires 43, 44 embedded in and extending through the thickness of the base. The ends of the wires are made to protrude slightly from the surfaces of the glass wafer 40 by etching the surfaces of the glass wafer. The metal wires 43, 44 are connected to the first base electrode 23 and the second base electrode 24, respectively, formed on the second main surface of the outer frame 51 of the crystal vibrating piece 20.

The under-surface of the base 45 includes a first external electrode 48 and a second external electrode 49. These external electrodes are metalized regions on the under-surface. The first external electrode 48 on the under-surface of the base 45 is connected to the first metal wire 43, and the second external electrode 49 on the under-surface of the base 45 is connected to the second metal wire 44.

Figure 1E:
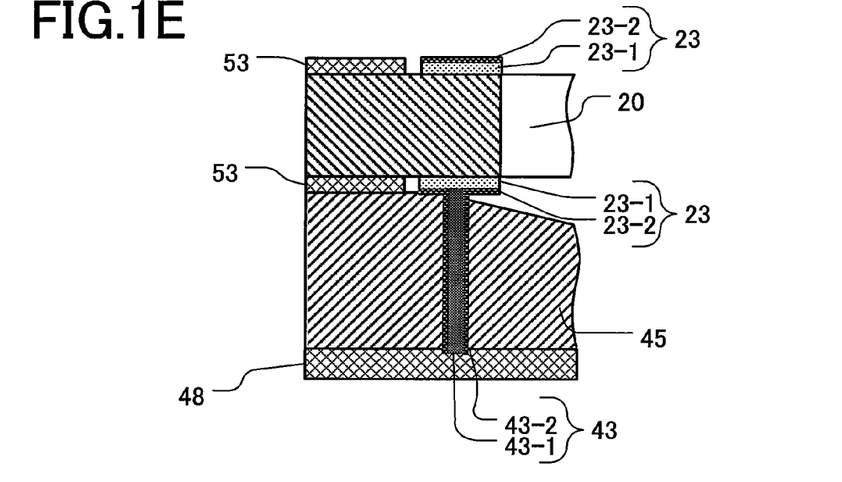
FIG. 1E is a partially enlarged cross-sectional view of FIG. 1A.
Figure 1F:
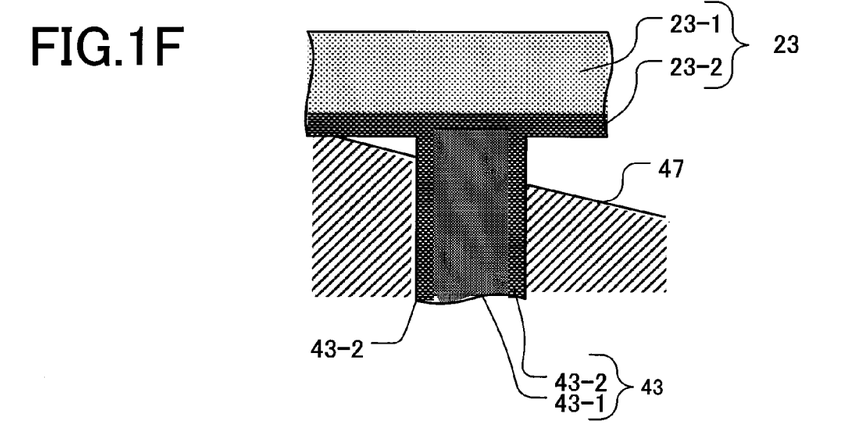
FIGS. 1F and 1G depict connection conditions of the first metal wire 43 and the first base electrode 23.
Figure 1G:
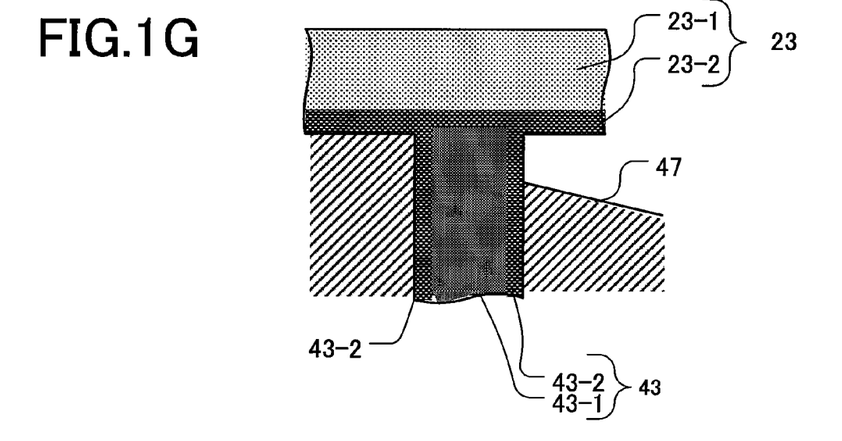

FIG. 1E is an enlarged sectional view of a corresponding region in FIG. 1A, and FIGS. 1F and 1G depict details of respective connecting conditions of the first metal wire 43 with the first base electrode 23. In FIG. 1E, the first and second metal wires 43, 44 are formed of, for example, a core wire 43-1, 44-1 of copper (Cu) plated with a gold (Au) layer 43-2, 44-2, respectively. The first base electrode 23 of the crystal vibrating piece 20 has a chrome (Cr) under-layer 23-1 and a gold (Au) layer 23-2 layered on the chrome layer.

As FIG. 1F shows, the end of the first metal wire 43 protrudes slightly from the surface of the base 45 as a result of surface-finishing of base 45 by glass etching and by forming the concave region in the base. At the time of anodic bonding of the package, described later, the lid 65, the outer frame 51, and the base 45 are pressurized with heat to 200° C. to 400° C. By this application of heat and pressure, the gold layer 43-2 of the metal wire 43 protruding from the surface is connected to the gold layer 23-2 of the first base electrode 23. Consequently, during anodic bonding of the package, conduction of the first external electrode 48 with the first base electrode 23 is assured. Conduction of the first external electrode 48 to the first base electrode 23 is also achieved during packaging, so that operating efficiency is improved and the cost can be reduced.

Figure 2A:
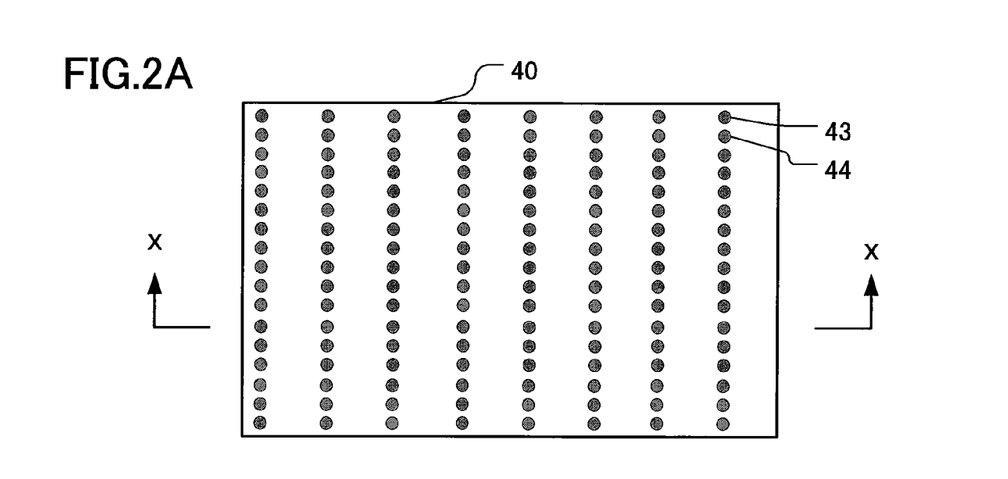
FIG. 2A is a schematic plan view of the glass wafer 40 containing metal wires.
Figure 2B:
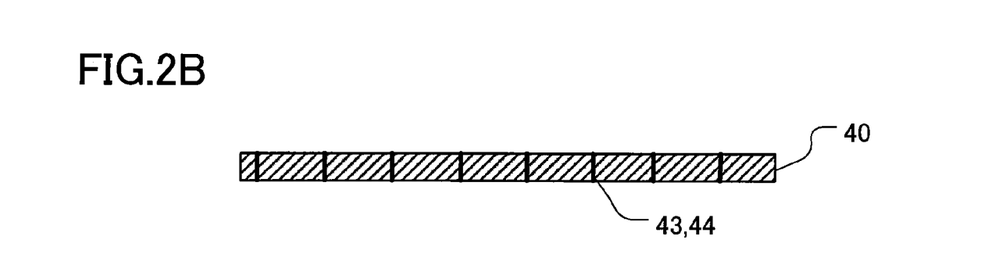
FIG. 2B is a cross-sectional view along the line X-X in FIG. 2A.

The end of the first metal wire 43 shown in FIG. 1G is slightly different from the end of the first metal wire 43 shown in FIG. 1F. Namely, as a result of glass etching performed earlier, at the protruding end of the wire, the edge surfaces of the wire 43 extend from the surface of the base 45. As shown in FIGS. 2A and 2B, the first and second metal wires 43, 44 in this condition are easily broken in the manufacturing process because they are very thin. To avoid breaking the wires, a portion of the side surfaces of the wires protruding from the base 45 actually contacts the glass material of the base. Comparing FIGS. 1F and 1G, in FIG. 1G the area of the gold layer 43-2 of the first metal wire 43 protruding from the glass surface is smaller than in FIG. 1F. Nevertheless, in FIG. 1G the gold layer 43-2 of the first metal wire 43 and the gold layer 23-2 of the first base electrode 23 can be bonded together to achieve good conduction.

Configuration of Glass Wafer Containing Metal Wires

FIG. 2A is a schematic plan view of an embodiment of a glass wafer 40 containing metal wires, and FIG. 2B is an elevational section along the line X-X in FIG. 2A. In FIG. 2A, the first metal wires 43 and the second metal wires 44 are arranged with predetermined spaces between them. The wires 43, 44 are embedded in the glass wafer 40. To cause the ends of the wires to protrude from the surfaces of the glass, the glass wafer 40 is etched to a depth of 100 to 300 Ångstroms (relative to the wire ends). As a result, the ends of the first metal wires 43 and the second metal wires 44 protrude from both the front and rear surfaces of the glass wafer. The first and second metal wires 43, 44 are made of iron (Fe), copper (Cu), kovar alloy (Fe:Ni:Co), nickel (Ni), or stainless steel, with a diameter of 0.1 to 0.5 mm.

The first metal wire 43 and the second metal wire 44 desirably are pre-processed to increase their affinity with glass and to facilitate close attachment. An example pre-processing of the first and second metal wires 43, 44 comprises surface roughening by sandblasting. The resulting increase in roughness of the wires increases their affinity for glass. Further pre-processing can be performed to provide the wires with superior electrical conductivity. Specifically, a gold layer is formed on the wires by first washing the wires and then applying gold plating to them. Whenever metal wires already having a rougher surface are used, sandblasting is unnecessary, but applying the gold layer is still advantageous.

Figure 3A:
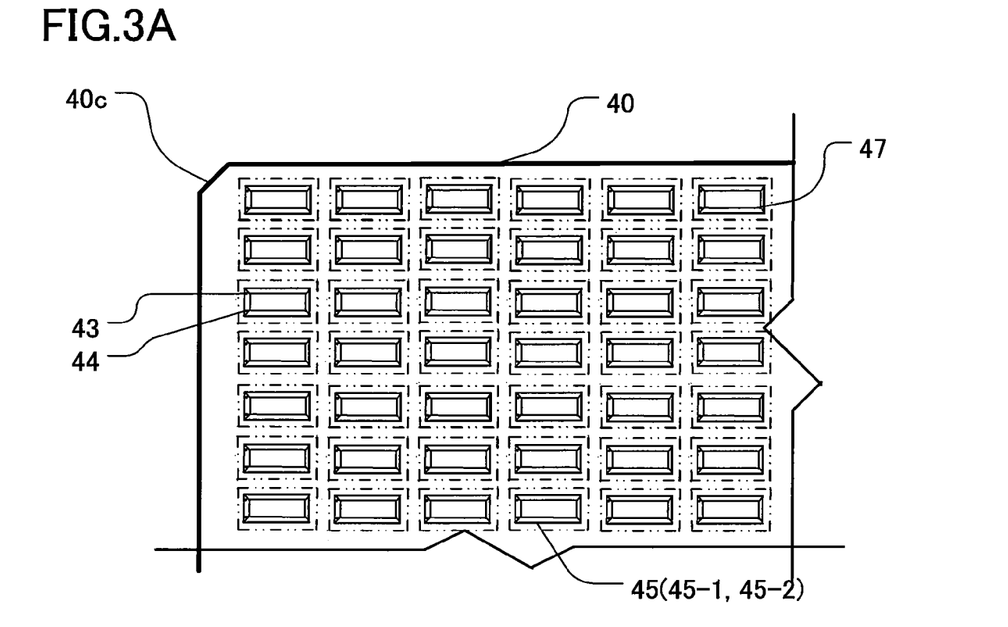
FIG. 3A is a partial plan view of the glass wafer 40, containing metal wires, forming multiple bases 45.
Figure 3B:
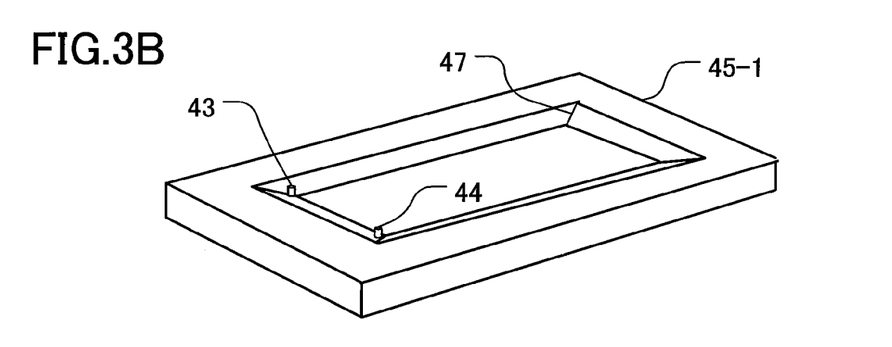
FIGS. 3B and 3C are perspective views showing two respective conditions in which the first metal wire 43 and second metal wire 44 protrude relative to a base 45.
Figure 3C:
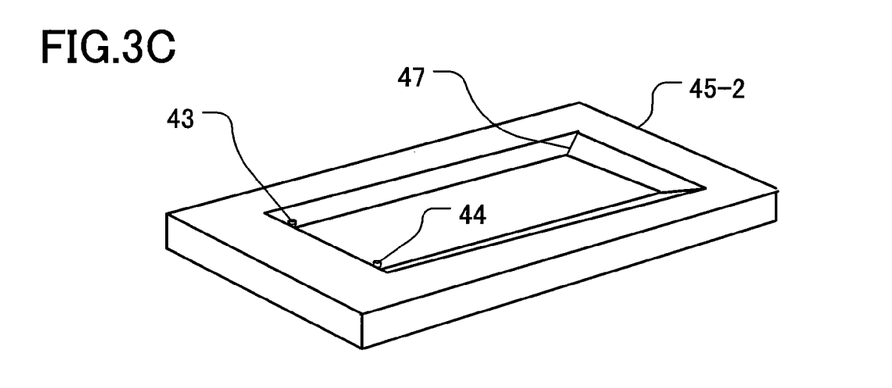

FIG. 3A is a plan view of a portion of the glass wafer 40 containing metal wires. Formed on the glass wafer are multiple bases 45. FIGS. 3B and 3C are perspective views of respective bases 45-1, 45-2, showing the condition of the first and second metal wires 43, 44 after etching the surface of the glass of each base. As shown in FIG. 3A the concave regions 47 are formed by etching the respective surface of the rectangular glass wafer 40 containing metal wires. In FIG. 3A the outline profile of each base 45 is indicated by a dot-dash line around the periphery of each concave region 47. The bases 45 remain attached to the glass wafer 40 until after the glass wafer is anodic-bonded to the crystal wafer (having a corresponding number and arrangement of frames 50) and the lid wafer (having a corresponding number and arrangement of lids). After anodic bonding to form the resulting three-wafer sandwich containing multiple piezoelectric devices, the piezoelectric devices are separated from one another by cutting using a dicing saw or laser saw. Hence, it is unnecessary to have voids around individual bases 45 in the glass wafer.

Further with respect to FIG. 3A, an orientation flat 40c (serving as a directional reference for the bases 45 is formed on one corner of the rectangular glass wafer 40 containing metal wires. The orientation flat 40c obviates the need to cut individual bases 45 from the glass wafer 40 for assembly. Rather, the glass wafer 40 containing metal wires can be handled intact during assembly.

FIGS. 3B and 3C show a single base 45 that has been cut from the glass wafer 40 containing metal wires. The particular base 45-1 shown in FIG. 3B has a concave region 47 formed by etching the glass, including in the area surrounding the first metal wire 43 and the second metal wire 44. The etching is performed sufficiently so that side surfaces of the wires at the ends of the wires 43, 44 protrude a relatively large amount from the glass surface left after etching. This relatively large protrusion provides, during assembly, respective large connecting regions of the gold layer 43-2 of the first metal wire 43 and of the gold layer 23-2 of the first base electrode 23, and the gold layer 44-2 of the second metal wire 44 and the gold layer 24-2 of the second base electrode 24.

(The first base electrode 23 and the second base electrode 24 are formed on the second main surface of the crystal vibrating piece 20 of the outer frame 51.) Particularly, as shown in FIG. 1E, the gold layer 23-2 of the first base electrode 23 and the gold layer 43-2 of the first metal wire 43 are completely connected.

The particular base 45-2 shown in FIG. 3B includes a concave region 47 formed by etching of the glass surface, including in areas surrounding the first metal wire 43 and the second metal wire 44. Etching proceeds until only part of the side surfaces at the ends of the wires 43, 44 protrude from the glass surface after etching. This leaves, for example, half of the side surfaces of the wires at the ends of the wires 43, 44 still covered by glass. This relatively more limited protrusion of the wires from the glass surface prevents the ends of the metal wires 43 and 44 from bending during a manufacturing process, without interfering with connections of the wires to respective electrodes. Particularly, as shown in FIG. 1G, the gold layer 23-2 of the first base electrode 23 and the gold layer 43-2 of the first metal wire 43 are completely connected.

As FIGS. 3B and 3C show, on the respective bases 45-1 and 45-2, the gold layers of the first metal wire 43 and the second metal wire 44 are connected to the gold layers of the first base electrode 23 and the second base electrode 24, respectively, without the need for connection electrodes for connecting the first base electrode 23 and the second base electrode 24. As a result, a photolithography step that otherwise would be required to form connection electrodes on the base 45 can be omitted, thereby reducing the number of process steps.

Manufacturing Crystal Frame and Tuning-Fork Type Crystal Vibrating Piece

Figure 4A:
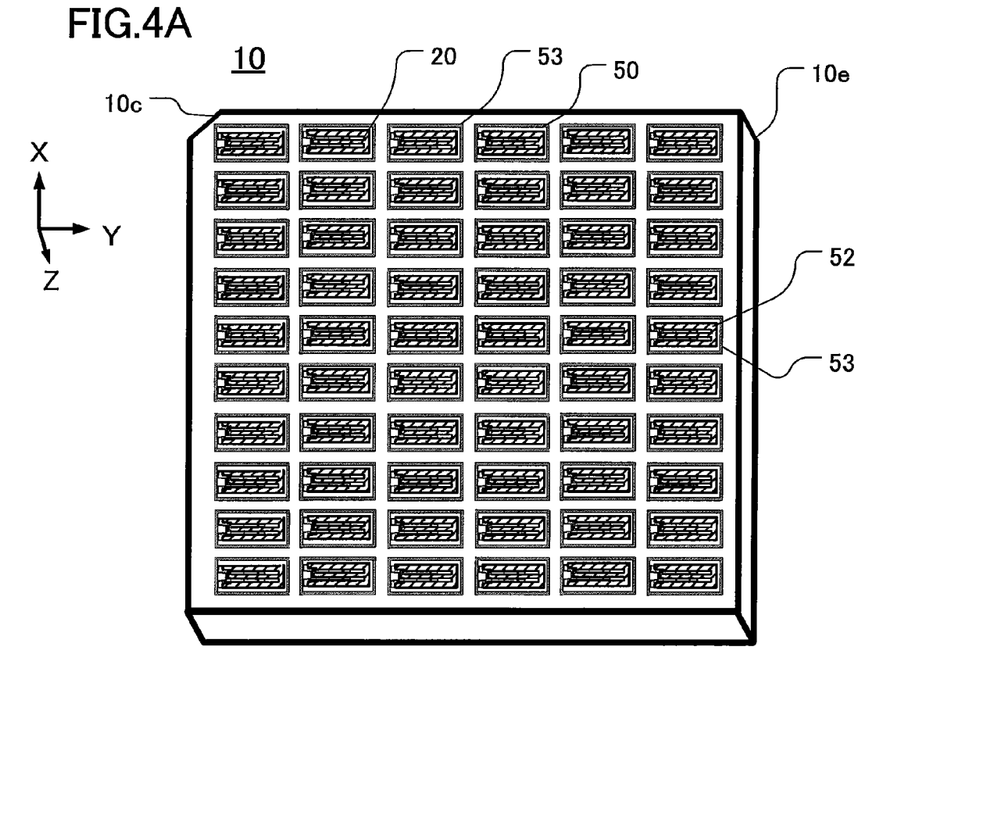
FIG. 4A is a schematic perspective view of the crystal wafer 10 on which are formed multiple tuning-fork type crystal vibrating pieces 20.

FIG. 4A is a schematic perspective (but substantially plan) view of a crystal wafer 10 on which multiple tuning-fork type crystal vibrating pieces 20 have been formed. As understood from FIG. 4A, the tuning-fork type crystal vibrating pieces 20 are formed by etching a rectangular square quartz-crystal wafer 10. More specifically, the tuning-fork type crystal vibrating pieces 20 are defined on the rectangular wafer 10 in the predetermined sizes by etching away the voids 52 corresponding to the shaded regions in the figure. To define an axial direction of the rectangular crystal wafer 10, an orientation flat 10c defining the crystal-lattice direction is formed at the appropriate region of the periphery 10e of the crystal wafer 10. Note that a metal film 53 is formed at the peripheral part of the voids 52 shaded on the crystal wafer 10.

The crystal frame 50 can be handled in a plate of crystal wafer 10 without having to be cut apart from the crystal wafer 10. Individual crystal vibrating devices are removed only after forming and anodically bonding together a three-wafer sandwich, from which individual devices are cut away using a dicing saw or a laser saw. Hence, it is unnecessary to have a void around each crystal frame 50, which allows many crystal frames 50 to be arranged on the crystal wafer 10. For convenience of this description, sixty tuning-fork type crystal vibrating pieces 20 are depicted on the crystal-wafer portion shown in FIG. 4A. But, it will be understood that, on an actual crystal wafer 10, hundreds or thousands of tuning-fork crystal vibrating pieces 20 can be formed.

Figure 4B:
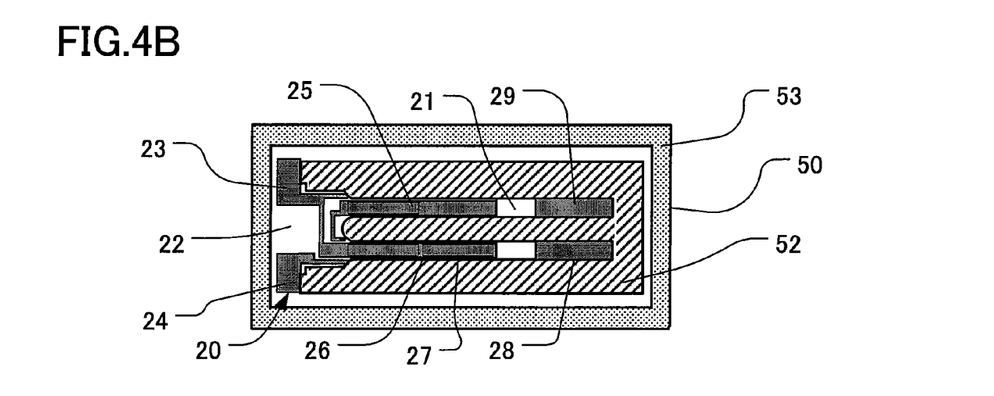
FIG. 4B is an enlarged plan view of one tuning-fork type crystal vibrating piece 20 surrounded by its crystal frame 50.

FIG. 4B is an enlarged plan view of an individual tuning-fork type crystal vibrating piece 20 and surrounding crystal frame 50. The crystal frame 50 has a predetermined size that is defined by a virtual line on the crystal wafer 10, thereby eliminating the need to define the frames 50 by surrounding voids. The crystal frame 50 includes a metal film 53 and surrounds the tuning-fork type crystal vibrating piece 20. The multiple crystal frames 50 on a single crystal wafer 10 can be handled and processed all together without having to be cut apart from the crystal wafer 10. A void 52 (depicted as a shaded region) defines the profile of the tuning-fork type crystal vibrating piece 20. The void 52 is formed by etching.

The respective first and second base electrodes 23, 24, first and second excitation electrodes 25, 26, and weights 28, 29 are all formed on the crystal vibrating pieces 20 while the pieces are still attached to the crystal wafer 10. Also formed are groove regions 27 on the vibrating arms 21 extending from the base 22. The first and second excitation electrodes 25, 26 are formed in the groove regions 27 to lower the CI (crystal impedance) value of the pieces 20.

The first and second base electrodes 23, 24, the first and second excitation electrodes 25, 26, and the weights 28, 29 on the tuning-fork type crystal vibrating piece 20 are formed by a photolithography process performed after forming respective metal films by sputtering or vacuum-deposition. Particularly, metal films comprising a layer of gold (Au) or silver (Ag) on an under-layer of chrome (Cr), nickel (Ni), or titanium (Ti) are formed by sputtering for use as base electrodes. In such an embodiment, the thickness of the chrome layer is 500-1000 Ångstroms, and the thickness of the gold layer is 500-1000 Ångstroms. Hence, the total thickness of each of the first and second base electrodes 23, 24 and of the first and second excitation electrodes 25, 26 is 1500-2000 Ångstroms.

Process for Manufacturing a Crystal Vibrator

Figure 5:
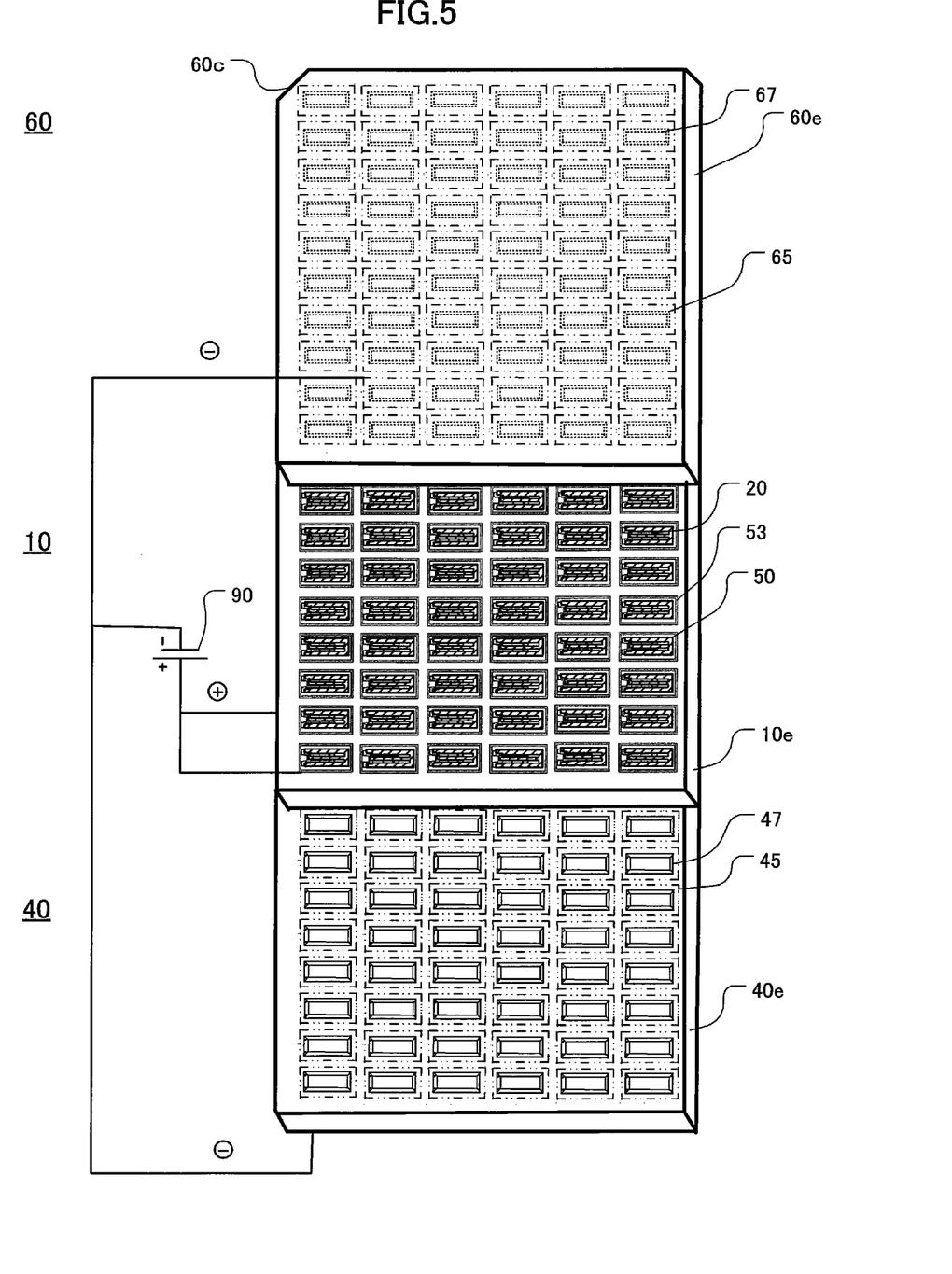
FIG. 5 is a perspective view of anodic bonding, showing that the glass wafer 60 in which lids 65 are formed, the crystal wafer 10 in which the tuning-fork type crystal vibrating pieces 20 are formed, and the glass wafer 40 in which the bases 45 are formed, are moved into position for forming a three-layer sandwich.

FIG. 5 shows the glass wafer 60 (on which multiple lids each having a lid concave region 67 have been formed), the crystal wafer 10 (on which multiple tuning-fork type crystal vibrating pieces 20 have been formed), and the glass wafer 40 (containing metal wires and on which multiple bases each having a base concave region 47) arranged in preparation for superposedly layering the wafers. To superposedly layer the wafers, they are arranged relative to each other so that the bases 45 are registered with corresponding crystal frames 50, which are registered with corresponding lids 65. For convenience of explanation, respective virtual lines are used to denote respective lids 65 on the glass wafer 60 and to denote respective bases 45 on the glass wafer 40 containing metal wires. The crystal frames 50 are shown on the crystal wafer 10. Also shown is wiring used for making anodic connections necessary for bonding the wafers together.

At the time the wafers are layered atop one another to form a three-layer sandwich, the lid concave regions 67 have already been formed by etching, the base concave regions 47 have already been formed by etching, and the first and second metal wires 43, 44 are protruding from the glass surface of the base wafer. In addition, the crystal vibrating pieces 20, metal film 53, and frames 50 have been formed on the crystal wafer 10. Also already formed on the tuning-fork type crystal vibrating piece 20 are, as explained in FIG. 1A, the first and second base electrodes 23, 24 and the first and second excitation electrodes 25, 26.

As noted, external wiring is used for applying electrical potentials to the wafers suitable for anodic bonding. The lid 65 and the base 45 are made of Pyrex® glass, borosilicate glass, or soda glass. These glasses contain metal ions such as sodium ions. The outer portions 51 of the crystal frames 50 have metal films 53 on both the front and back surfaces. This metal film 53 desirably is made of aluminum. In the three-layer sandwich, the crystal frames 50 including respective tuning-fork type crystal vibrating pieces 20 are situated between respective lids 65 (with respective lid concave portions 67 facing the tuning-fork type crystal vibrating pieces 20) and bases 45 (with respective base concave portions 47 facing the tuning-fork type crystal vibrating pieces 20). Alternatively to being made of aluminum, the metal films 53 can be formed with a chrome under-layer with surficial gold layer layered on the chrome layer By way of example, the glass wafer 60, the glass wafer 40 containing metal wires, and the crystal wafer 10 are 4 inches on a side. The orientation flats 60c, 40c, and 10c allow the three wafers to be aligned correctly with respect to each other. After alignment, the three-wafer sandwich is heated to 200° C. to 400° C. while applying mechanical pressure to the sandwich in a vacuum or an inert-gas atmosphere. The top surfaces of the lids 65 and the bottom surfaces of the bases 45 are kept at negative potential and the metal films 53 of the front and back surfaces of the outer frame 51 are kept at positive potential. The potential (400 Vdc) is provided by a dc power source 90 for ten minutes as the sandwich layers are compressed. Then, the wafer layers are anodically bonded together to form multiple crystal vibrators 100 (each in a package 80 containing a vacuum state filled with an inert gas). During anodic bonding, the first and second base electrodes 23, 24 are securely bonded to the first and second metal wires 43, 44, respectively.

After completion of anodic bonding, the wafer sandwich is cut using a dicing saw or laser saw to separate individual crystal vibrators 100. Since packaging and electrode bonding have been performed in a single step on an entire wafer sandwich, productivity is substantially improved.

Process for Manufacturing Tuning-Fork Type Crystal Vibrating Pieces

Figure 6:
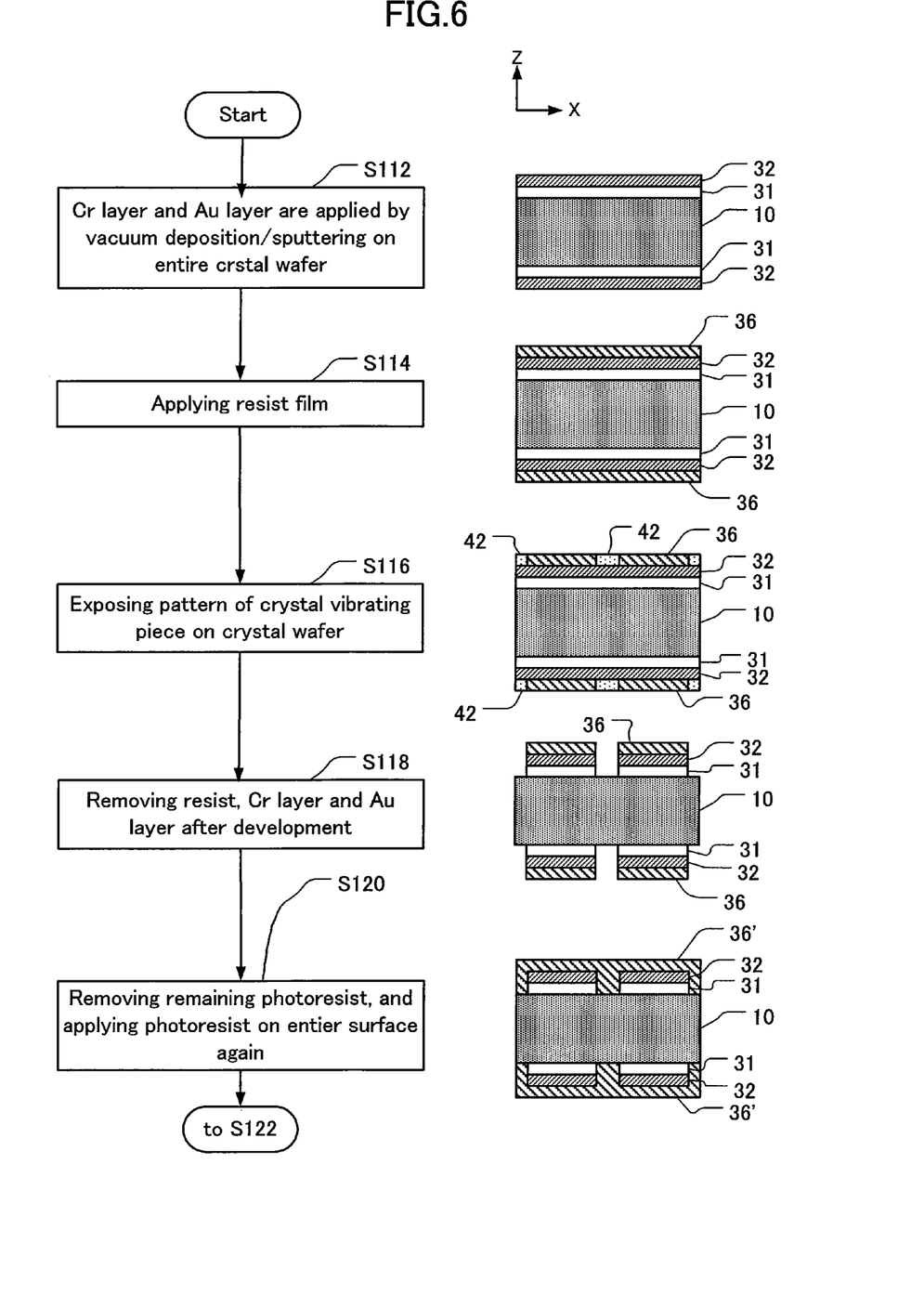
FIG. 6 is a flow-chart of an embodiment of a process for forming profiles and groove regions of the tuning-fork type crystal vibrating piece 20.
Figure 7:
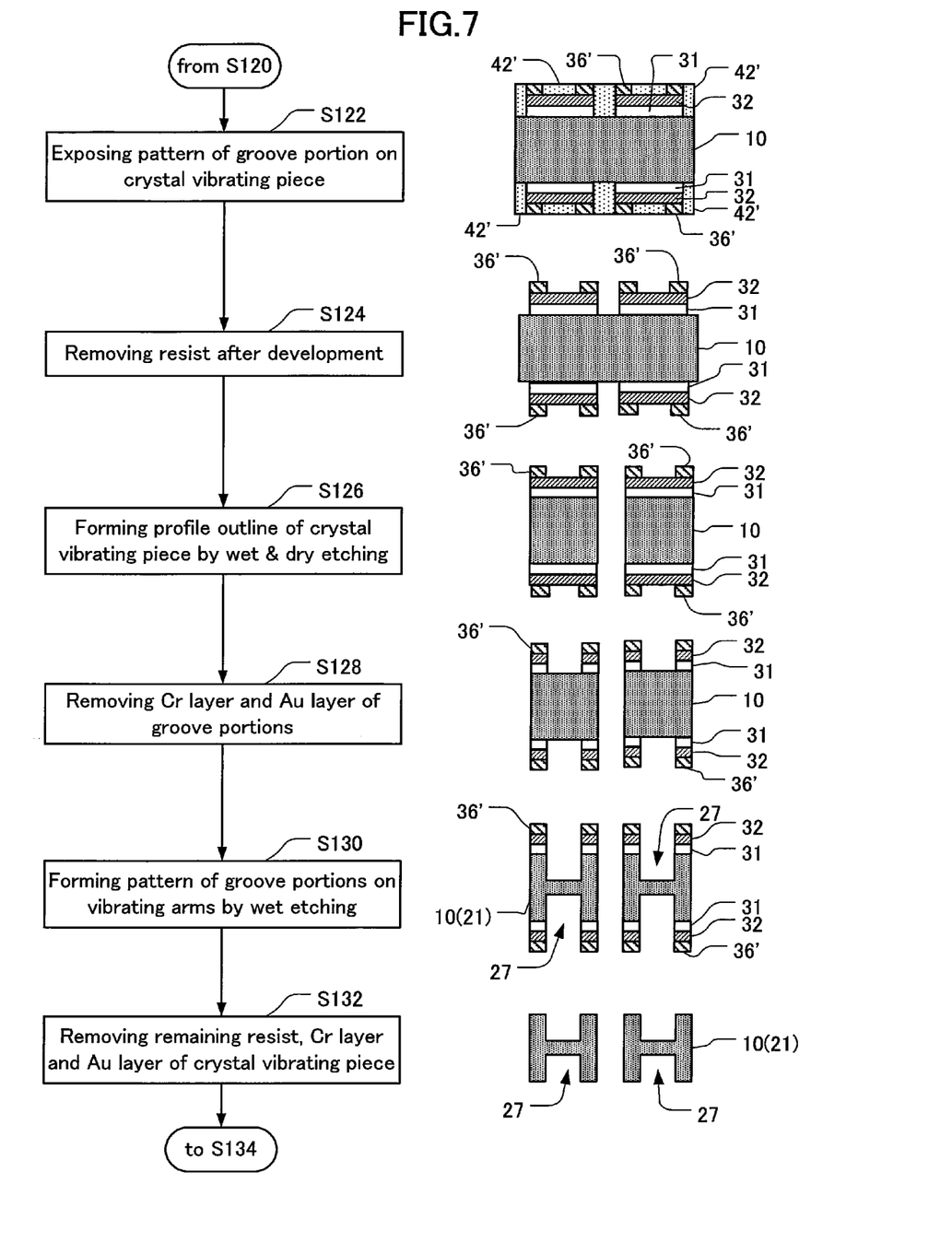
FIG. 7 is a flow-chart of an embodiment of a process for forming profile and groove regions of the tuning-fork type crystal vibrating piece 20.
Figure 8:
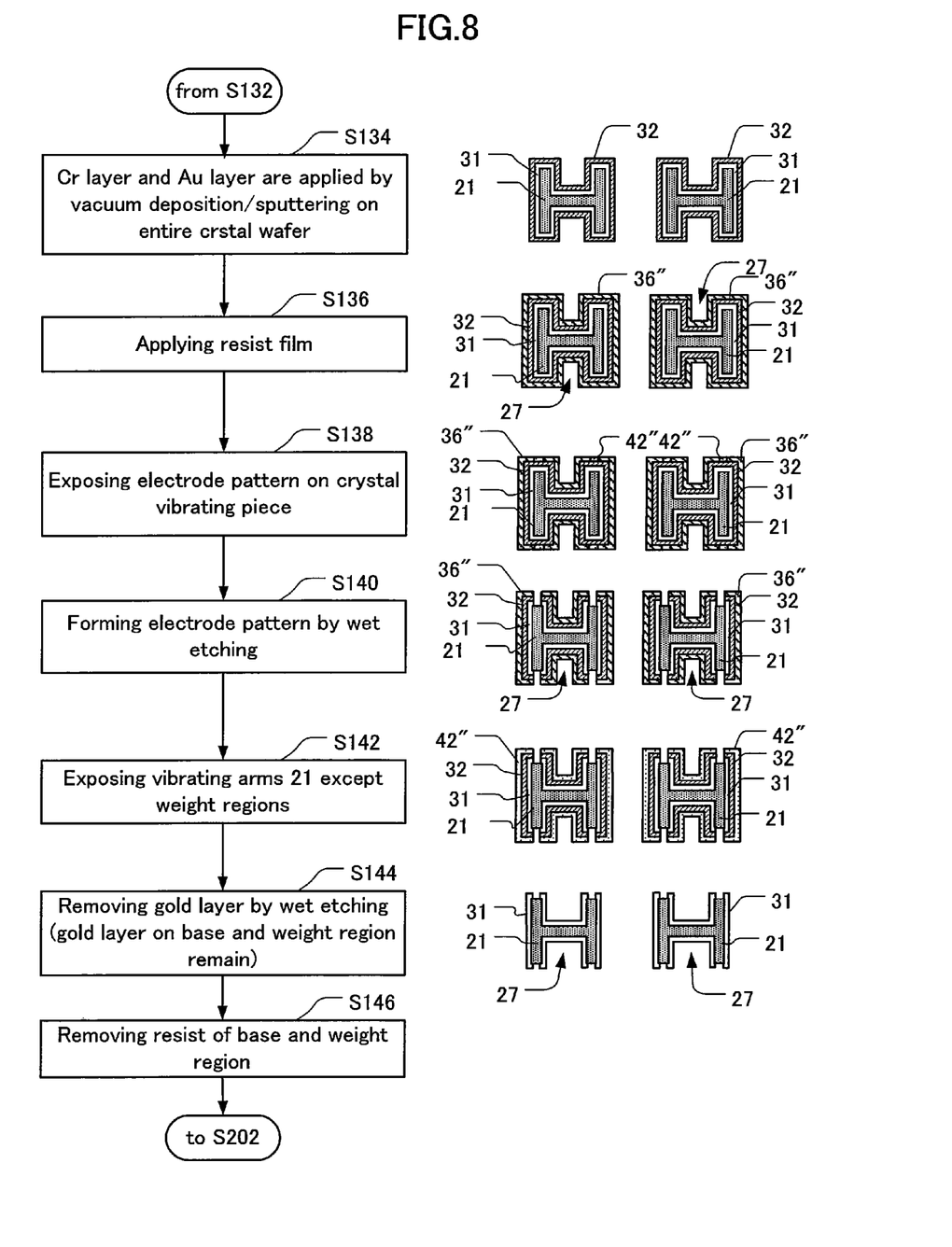
FIG. 8 is a flow-chart of an embodiment of a process for forming electrodes of the tuning-fork type crystal vibrating piece 20.

FIGS. 6, 7, and 8 are flow-charts of respective portions of a process for forming the arm profiles, grooves, and electrodes of an exemplary tuning-fork type crystal vibrating piece 20. Each depicted step of forming the arms includes a respective elevational section of the crystal wafer 10 showing the structure resulting from the respective step.

Forming the Profile and Groove Portions of the Tuning-Fork Type Crystal Vibrating Piece First, a crystal (e.g., quartz) wafer 10 is prepared at step S112 in FIG. 6. Then, a corrosion-resistant film is applied, by sputtering or vacuum deposition for example, to the entire surface of the crystal wafer 10. Gold (Au) or silver (Ag) are desirable for forming the corrosion-resistant film. However, when a crystal wafer 10 is used as a piezoelectric material, it is difficult to form gold (Au) or silver (Ag) directly on the wafer surface. Hence, a layer of chrome (Cr), nickel (Ni), or titanium (Ti) is first applied as an under-layer. In the depicted embodiment, a metal film having a chrome (Cr) layer 31 with an overlying gold (Au) layer 32 is used as the corrosion-resistant film. By way of example, the thickness of the chrome layer 31 is 500 Ångstroms, and the thickness of the gold layer 32 is 1000 Ångstroms. The crystal wafer 10 upon completion of step 112 is shown on the right of step S112.

In step S114, on the crystal wafer 10 on which the chrome layer 31 and the gold layer 32 have been formed, a photoresist layer 36 is applied evenly by spin-coating, for example. An example photoresist 36 is a positive photoresist with novolac resin. The crystal wafer 10 upon completion of step S114 is shown on the right of step S114.

Next, in step S116, the profile pattern of the tuning-fork type crystal vibrating piece 20 is defined by a photomask that is used for exposing photoresist layers 36 on the surfaces of the crystal wafer 10. Exposures are performed using an exposure device (not shown). The resulting pattern of exposed photoresist layer 42 and unexposed photoresist layer 36 is shown to the right of step S116.

In step S118, the photoresist layer 36 of crystal wafer 10 is developed, and the exposed photoresist layer 42 is removed. Portions of the gold layer 32 now revealed by removal of the exposed photoresist layer 42 are etched using an aqueous solution of iodine and potassium iodide. Then, portions of the chrome layer 31 revealed by removal of the gold layer 32 are etched using an aqueous solution of ceric ammonium nitrate and acetic acid. The concentrations of the aqueous solution, etching temperature, and etching time are controlled to avoid over-etch. Completion of etching results in complete removal of the corrosion-resistant film from the revealed locations. As shown to the right of step S118, a structure is thus formed in which the crystal wafer 10 now defines the profile pattern of the tuning-fork type crystal vibrating device 20.

In step S120, remaining photoresist layer 36 is stripped, and a new layer of photoresist 36' is applied by spin-coating or spraying, for example. The result of this step is shown to the right of step S120.

Turning now to FIG. 7, in the next step S122 a pattern defining the groove regions 27 is exposed on corresponding regions of the photoresist layer 36' on the surfaces of the vibrating arms 21 to form the groove regions 27 on the vibrating arms 21 of the tuning-fork type crystal vibrating piece 20. The result of this step is shown to the right of step S122.

In step S124, the photoresist layers 36' are developed, and the exposed photoresist layers 42' are removed. As shown to the right of step S124, the exposed photoresist layer 42' is removed in regions destined to become groove regions 27, but the corrosion-resistant film is still present in these regions. Removal of the exposed photoresist 42' forms a structure in which the profile pattern of the tuning-fork type crystal vibrating piece 20 reappears on the crystal wafer 10, as shown to the right of step S118. The result of this step is shown to the right of step S124.

In step S126, regions of the crystal wafer 10 revealed by removal of the exposed photoresist layer 42' and the corrosion-resistant film are wet-etched to form the profile of the tuning-fork type crystal vibrating piece 20. The wet-etching solution can be, for example, hydrofluoric acid (HF) or ammonium bifluoride (NH4F/HF). The result of this step is shown to the right of step S126.

In step S128, the revealed corrosion-resistant film is removed by another etching step to form the groove regions 27 on the arms. The gold layer 32 of the corrosion-resistant film is etched using, for example, an aqueous solution of iodine and potassium iodide. Then, the chrome layer 31, revealed by removing the gold layer 32, is etched using an aqueous solution of ceric ammonium nitrate and acetic acid, for example. The crystal wafer 10 after etching of the corrosion-resistant film is shown to the right of step S128.

Next, in step S130, wet-etching is performed on the crystal wafer 10 to form the groove regions 27. Example etching solutions are hydrofluoric acid (HF) or ammonium bifluoride ($NH_4F$/HF). Wet-etching regions of the crystal wafer 10 revealed by removal of the photoresist layer 36' and the corrosion-resistant film forms the groove regions 27. As shown to the right of step S130, etching is carefully controlled to prevent etching completely through the crystal wafer 10 in the groove regions 27 (such over-etching would cause the groove regions to become through-holes).

Next, in step S132, remaining portions of the photoresist layer 36', the chrome layer 31, and the gold layer 32 on the tuning-fork type crystal vibrating piece 20 are removed to complete formation of the groove regions 27 on the vibrating arms 21. The structure resulting from this step is shown to the right of step S132.

Electrode-Formation Process

Turning now to FIG. 8, in step S134, the tuning-fork type crystal vibrating piece 20 is washed with purified water, followed by formation of a first metal layer 31 over the entire surface of the tuning-fork type crystal vibrating piece 20. The first metal layer 31 is formed of chrome (Cr), nickel (Ni), or titanium (Ti), and serves as an under-layer for subsequent formation of a second metal layer 32 that, together with the first metal layer 31, will be configured into driving electrodes for the tuning-fork type crystal vibrating piece 20. The first metal layer 31 is formed by vacuum-deposition or sputtering. In this depicted embodiment, the first metal layer 31 is a chrome layer 31, and the second metal layer 32 is a gold layer. By way of example, the thickness of the chrome layer 31 is 500 Ångstroms, and the thickness of the gold layer 32 is 1000 Ångstroms. The result of this step is shown to the right of step S134.

In step S136 a photoresist 36" is applied over the surface of tuning-fork type crystal vibrating piece 20 by spraying or the like. Because the groove regions 27 have already been formed, the photoresist 36" is applied evenly on all surfaces of the groove regions 27 as well as in regions other than the groove regions. The result of this step is shown to the right of step S136.

In step S138, a photomask corresponding to the electrode pattern is prepared, and the electrode patterns are exposed on the crystal wafer 10 covered with the photoresist layer 36". The electrode pattern is exposed on both sides (front and back) of the tuning-fork type crystal vibrating piece 20. The regions of exposed photoresist 42" and non-exposed photoresist 36" on the vibrating arm 21 are depicted to the right of step S138.

In step S140, the photoresist layer 36" is developed and the exposed photoresist layer 42" is removed. The remaining photoresist layer 36" corresponds to the electrode patterns and serves as an etching mask. Etching of the metal film destined to become electrodes is performed. The portions of the gold layer 32 revealed by removing the exposed photoresist 42" corresponding to the electrode patterns is etched by, for example, an aqueous solution of iodine and potassium iodide. Then, the chrome layer 31 is etched by an aqueous solution of ceric ammonium nitrate and acetic acid. The electrode in a vibrating arm 21 is depicted to the right of step S140.

In the figure to the right of step S140, unexposed photoresist layer 36" remains in the groove regions 27 and on the side surfaces of the vibrating arms 21. In step S142 further exposure is made of the remaining photoresist layer 36" on the vibrating arms 21. As shown to the right of step S142, exposed photoresist 42" extends around the vibrating arms 21 (except in regions destined to be weights).

In step S144, the photoresist layer 36" is developed, and the exposed photoresist layer 42" is removed. Portions of the gold layer 32 revealed by removal of the exposed photoresist layer 42" is etched by, for example, an aqueous solution of iodine and potassium iodide. At this point in the process, the gold layer 32 has been removed from the entire vibrating arms 21 (except in the weight regions) to reveal the chrome layer 31. The removed gold (Au) can be recovered from the etching solution. This removal of the gold layer 32 from many parts of each vibrating arm 21 yields vibrating arms 21 exhibiting less fluctuation of vibration frequency that otherwise would occur during times of thermal expansion.

In step S146, the remaining portions of the unexposed photoresist layer 36" on the base 22 and weights 28, 29 are stripped. Upon removal of the remaining photoresist, corresponding regions of the gold layer 32 remain on the base 22 and weights 28, 29. Thus, whereas the chrome layer 31 and gold layer 32 are retained on the base 22 and weights 28, 29 of the tuning-fork type crystal vibrating piece 20, the electrodes 23, 25 have only the chrome layer 31 that also remains in the groove regions 27 and on side surfaces of the vibrating arms 21.

Process for Frequency Adjustment and Packaging

Upon completing the foregoing process, tuning-fork type crystal vibrating pieces 20 on which the electrodes 23, 25 and groove regions 27 have been formed are obtained. Now they need to be packaged by applying lids and bases.

Figure 9:
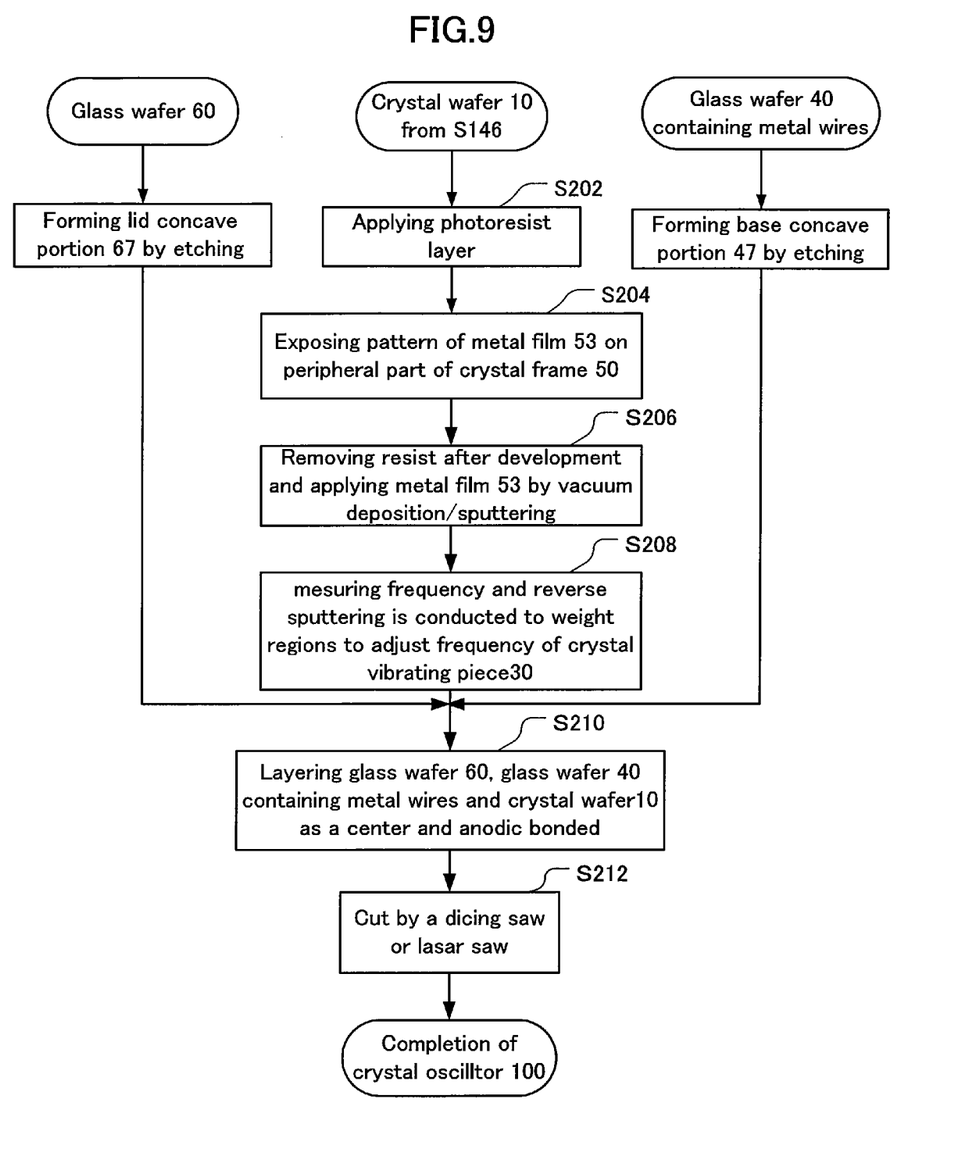
FIG. 9 is a flow-chart of an embodiment of a process for adjusting the vibration frequency of and for packaging the tuning-fork type crystal vibrating piece 20.

FIG. 9 is a flow-chart of steps of an embodiment of a process for packaging the tuning-fork type crystal vibrating pieces 20. In step S202, to provide a metal film 53 for anodic bonding on the crystal wafer 10 having the tuning-fork crystal vibrating pieces 20, a photoresist film is applied on the entire surface of the crystal wafer 10. The photoresist is applied by spin coating, spraying, or the like.

In step S204 an exposure apparatus (not shown) and photomask (not shown; defining the pattern of the metal film 53) is used to expose the photomask pattern into a respective layer of photoresist on each surface of the crystal wafer 10. In step S206 the photoresist layers on the crystal wafer 10 are developed, and the exposed photoresist is removed. On the resulting patterned photoresist, the metal films 53 are formed by vacuum deposition or sputtering, for example. In this manner respective metal films 53 are formed on both surfaces of the crystal wafer 10.

In step S208 a beam of laser light is irradiated onto the weights 28, 29 on the distal ends of the vibrating arms 21 of each tuning-fork type crystal vibrating piece 20. Thus, portions of the relatively massive metal layers on the vibrating arms 21 are removed by evaporation and sublimation as required to adjust the vibration frequency of the arms. In other words, frequency adjustment is performed by reducing the mass of the arms as required.

In step S210, a three-layer sandwich is formed of the crystal wafer 10 (having the tuning-fork type crystal vibrating pieces 20 of which the vibration frequencies have been adjusted) placed in between a glass wafer 60 (defining lid concave regions 67) and a glass wafer 40 (including metal wires and defining base concave regions 47). Using the respective orientation flats 60c, 40c, 10c on these three wafers, they are layered, aligned, and registered exactly with respect to each other. The three-layer sandwich is bonded together by anodic bonding performed either in a vacuum or in an inert-gas atmosphere. Thus, crystal vibrators 100 are formed having packages 80 that are either evacuated or filled with an inert gas. During anodic bonding, the first base electrode 23 is bonded securely to the first metal wire 43, and the second base electrode 24 is bonded securely to the second metal wire 44.

In step S210 individual crystal vibrators 100 are cut from the bonded sandwich using a dicing saw or a laser saw. Thus, fabrication of the crystal vibrators 100 is completed.

Various representative embodiments are described above. However, it will be understood by persons of ordinary skill in the art that any of the foregoing embodiments can be modified or changed while remaining within the scope of the invention. For example, in the crystal vibrator 10, the crystal material can be a piezoelectric single-crystal material such as lithium niobate. The present invention can be also applied to AT-cut crystal unit pieces and SAW resonator.

What is claimed is:

1. A piezoelectric device, comprising:
   a piezoelectric vibrating piece comprising first and second electrodes, a first surface, and an opposing second surface;
   a base made of glass and having a first surface and an opposing second surface, the second surface of the piezoelectric vibrating piece being mounted to the first surface of the base; and
   a lid attached to the first surface of the piezoelectric vibrating piece to form, with the base and piezoelectric vibrating piece, a package containing the piezoelectric vibrating piece;
   the glass base comprising first and second metal wires having respective ends, with respective side surfaces, protruding at least partially from the first surface of the base, the protruding ends and side surfaces being connected to the first and the second electrodes, respectively.

2. The piezoelectric device of claim 1, wherein, with respect to each of the first and second metal wires, a portion of the side surface at the respective end is covered by the glass of the base.

3. The piezoelectric device of claim 1, wherein with respect to the first and second metal wires:
   each metal wire comprises a surficial gold (Au) layer; and
   the protruding gold-layered side surfaces of the protruding ends are connected to the first and second electrodes, respectively.

4. The piezoelectric device of claim 3, wherein, with respect to each of the first and second metal wires, a portion of the side surface at the respective end is covered by the glass of the base.

5. The piezoelectric device according to claim 3, wherein, with respect to each of the first and second wires, substantially the entire side surface at the respective end protrudes from the first surface of the base.

6. The piezoelectric device according to claim 1, wherein, with respect to each of the first and second wires, substantially the entire side surface at the respective end protrudes from the first surface of the base.

* * * * *